(12) United States Patent
Ahlborn

(10) Patent No.: US 12,276,042 B2
(45) Date of Patent: Apr. 15, 2025

(54) CRYSTAL SUPPORT AND CRYSTAL GROWING PLANT HAVING SUCH A CRYSTAL SUPPORT

(71) Applicant: PVA TePla AG, Wettenberg (DE)

(72) Inventor: Hans-Juergen Ahlborn, Buseck (DE)

(73) Assignee: PVA TePla AG, Wettenberg (DE)

( * ) Notice: Subject to any disclaimer, the term of this patent is extended or adjusted under 35 U.S.C. 154(b) by 105 days.

(21) Appl. No.: 17/791,633

(22) PCT Filed: Jan. 11, 2021

(86) PCT No.: PCT/DE2021/200000
§ 371 (c)(1),
(2) Date: Jul. 8, 2022

(87) PCT Pub. No.: WO2021/139857
PCT Pub. Date: Jul. 15, 2021

(65) Prior Publication Data
US 2023/0040130 A1   Feb. 9, 2023

(30) Foreign Application Priority Data
Jan. 9, 2020   (DE) .................. 10 2020 100 331.5

(51) Int. Cl.
*C30B 15/32*   (2006.01)
*C30B 15/30*   (2006.01)

(52) U.S. Cl.
CPC .............. *C30B 15/32* (2013.01); *C30B 15/30* (2013.01)

(58) Field of Classification Search
CPC .......... C30B 15/30; C30B 15/32; C30B 35/00
See application file for complete search history.

(56) References Cited

U.S. PATENT DOCUMENTS 5,126,113 A   6/1992   Yamagishi et al.
5,935,329 A * 8/1999   Schulmann ............. C30B 15/00
                                                   117/911
(Continued)

FOREIGN PATENT DOCUMENTS

DE   197 10 856 B4   9/1998
DE   199 39 714 A1   2/2001
(Continued)

OTHER PUBLICATIONS

German Search Report issued in German application No. 10 2020 100 331.5 dated Sep. 7, 2020, with Statement of Relevancy (Eight (8) pages).

(Continued)

*Primary Examiner* — Matthew J Song
(74) *Attorney, Agent, or Firm* — Reising Ethington P.C.

(57) ABSTRACT

A crystal support for a crystal pulling system includes two catches that have a respective retaining jaw that is placeable against a thickened neck portion of a crystal. The two catches are moveable into a bearing position in which the two catches bear on the thickened neck portion and into a releasing position in which the two catches are away from the thickened neck portion. In the bearing position, respective contact points of each retaining jaw at which the retaining jaws bear on the thickened neck portion are located on respective sides of a parting plane. The parting plane extends at an angle to at least one of the pivot axes of the catches and, in the bearing position, the respective contact points of each retaining jaw are located on both sides of a crystal plane that extends through an axis of the crystal and parallel to the pivot axes.

13 Claims, 3 Drawing Sheets

(56) References Cited

U.S. PATENT DOCUMENTS

| | | | |
|---|---|---|---|
| 6,299,684 B1* | 10/2001 | Schulmann | C30B 15/30 |
| | | | 117/911 |
| 8,470,093 B2 | 6/2013 | Muehe et al. | |
| 9,593,433 B2 | 3/2017 | Suda et al. | |
| 2010/0064965 A1* | 3/2010 | Muehe | C30B 15/30 |
| | | | 117/35 |

FOREIGN PATENT DOCUMENTS

| | | |
|---|---|---|
| DE | 10 2006 034 433 A1 | 1/2008 |
| DE | 10 2008 047 599 A1 | 4/2010 |
| DE | 11 2012 001 596 T5 | 12/2014 |

OTHER PUBLICATIONS

PCT/DE2021/200000, International Search Report dated Jun. 18, 2021 (Two (2) pages).

* cited by examiner

CRYSTAL SUPPORT AND CRYSTAL GROWING PLANT HAVING SUCH A CRYSTAL SUPPORT

BACKGROUND AND SUMMARY OF THE INVENTION

The invention relates to a crystal support for a crystal pulling system, which has two catches that are each foldable about a pivot axis and have retaining jaws that are able to be placed against a thickened neck portion of the crystal to be pulled, and has means for connecting the catches to a supporting cable of the crystal pulling system, wherein the catches can take up a bearing position, in which they bear on the thickened neck portion, and a releasing position, in which they are away from the thickened neck portion.

Crystal supports of this kind are used in crystal pulling systems in order for it to be possible to pull crystals with a large diameter from the melt. During the pulling of a crystal, first of all a neck is created from a seed crystal, the neck—in order to create a crystal structure that is as uniform as possible—being kept as thin as possible. Only when defects are no longer to be expected in the crystal structure is the pulling of the actual crystal started, which—in order to obtain wafers with as large a diameter as possible—should be as thick as possible. Furthermore, the crystal should be as long as possible, resulting in a high crystal weight.

While it is being pulled, the pulled crystal hangs only on the thin neck, and so there is the risk of the latter breaking.

Therefore, it has already been proposed to first of all create a thickened portion in the neck before starting the pulling of the actual crystal, a cable-pull actuated crystal support being able to engage under the thickened portion. The crystal to be pulled therefore hangs not only on the neck but is carried by the crystal support via the thickened portion.

The previously proposed crystal supports, which are described, inter alia, in DE 10 2006 034 433 A1, DE 11 2012 001 596 T5, DE 197 10 856 A1 and DE 10 2008 047 599 A1 have in common that two catches are arranged on a carrier that surrounds the crystal or the crystal neck, the pivot axes of the catches extending tangentially to the crystal and the free ends of the catches having retaining jaws that are folded under the thickened neck portion. The retaining jaws, or a parting plane between the retaining jaws, extend parallel to the pivot axes. In the bearing position, the contact points at which the jaws come to bear on the thickened neck portion are each located on a side of a parting plane that extends parallel to the pivot axes through the axis of the crystal. The two jaws are therefore formed symmetrically to this parting plane. Since the catches press against the thickened portion obliquely from below, in addition to the axial forces, radial forces are also exerted, which make it necessary to embody the carrier accordingly in a stable manner in order that the catches are not pushed away to the sides. It may be conceivable to arrange the catches relatively steeply. This entails the risk, however, of the catches slipping on the thickened neck portion. A further drawback is that the weight of the growing crystal loads the jaws in the direction of their releasing positions. This entails the risk of the jaws retreating, with the result that the crystal can escape to the sides in the parting plane.

The invention is therefore based on the object of creating a compact and stable crystal support which has as lightweight a structure as possible.

To solve the problem, the invention provides that the parting plane extends at an angle to at least one of the pivot axes, and that, in the bearing position, the contact points of each jaw are located on both sides of a crystal plane that extends through the axis of the crystal and parallel to one of the pivot axes.

This has the result that the catches can be oriented steeply since the forces that act on the catches do not generate a torque, or generate only a low torque, about the pivot axis. The main supporting forces rather act parallel to the pivot axes. As a result of the steep arrangement of the catches, the crystal support requires less space and can therefore be constructed in a compact manner. Furthermore, the catches are subjected more to pressure than to bending stress, thereby allowing a lightweight structure. The steep support of the crystal exhibits low vibration, this having positive repercussions on the control of the pulling operation.

The structure is particularly simple when the pivot axes extend parallel to or coaxially with one another, and when the parting plane extends perpendicularly thereto.

With a coaxial arrangement of the pivot axis, a radial force component is almost entirely avoided, with the result that the bearings of the pivot axes only have to absorb the unavoidable axial forces that are brought about by the weight of the crystal.

The actuation of the catches preferably takes place by way of supporting cables. Therefore, each catch is connected to supporting cable holders.

Preferably, these are mounted on the catches about an axis extending parallel to the pivot axis.

To actuate the catches, the invention provides that the catches are mounted pivotably on a carrier which has a central clearance and on the top side of which two control cable holders are located. If the carrier is lowered, the catches are folded together by the supporting cables that remain in position.

The carrier also makes it possible to arrange the control cable holders in an offset manner with respect to the pivot axes. In this way, the control cables and the supporting cables can be arranged in a plane, thereby allowing a compact arrangement of the cable pull drums.

A very narrow structure of the crystal support is achieved when the pivot axes are formed by bearing stubs to which the control cable holders are fastened.

Preferably, two catches are used, which have an identical structure. A catch has a bracket-like shape, wherein the mounting on the pivot axis takes place at the ends of the bracket. A base is located in each case to the side of the vertex of the bracket, the base protruding perpendicularly from the bracket and having, on its side facing the vertex of the bracket, an inner side that extends obliquely or perpendicularly to the bracket and forms the retaining jaw. The retaining jaw has a semicircular recess into which the thickened portion can be introduced. On the rear side of the brackets, the supporting cable holders are mounted.

In each case two catches are arranged together in the carrier such that their inner sides with the base are located opposite one another, wherein, when they are folded together, the catches slide the protrusions past one another such that the retaining jaws are located opposite one another and form a closed circular recess, into which the thickened neck portion can be introduced.

The invention also relates to a crystal pulling system having a crystal support, wherein a supporting cable drum and a control cable drum are located in the head of the crystal pulling system, wherein the supporting cable and the control cable are each received on the side of the associated drum that faces the other drum.

The axes of the two drums extend in parallel at the same height, wherein the supporting cables and the control cables are received in a gap between the drums and are wound in opposite directions to one another on the respectively associated drum.

The invention will be explained in more detail in the following text on the basis of two exemplary embodiments.

DETAILED DESCRIPTION OF THE DRAWINGS

Figure 1:
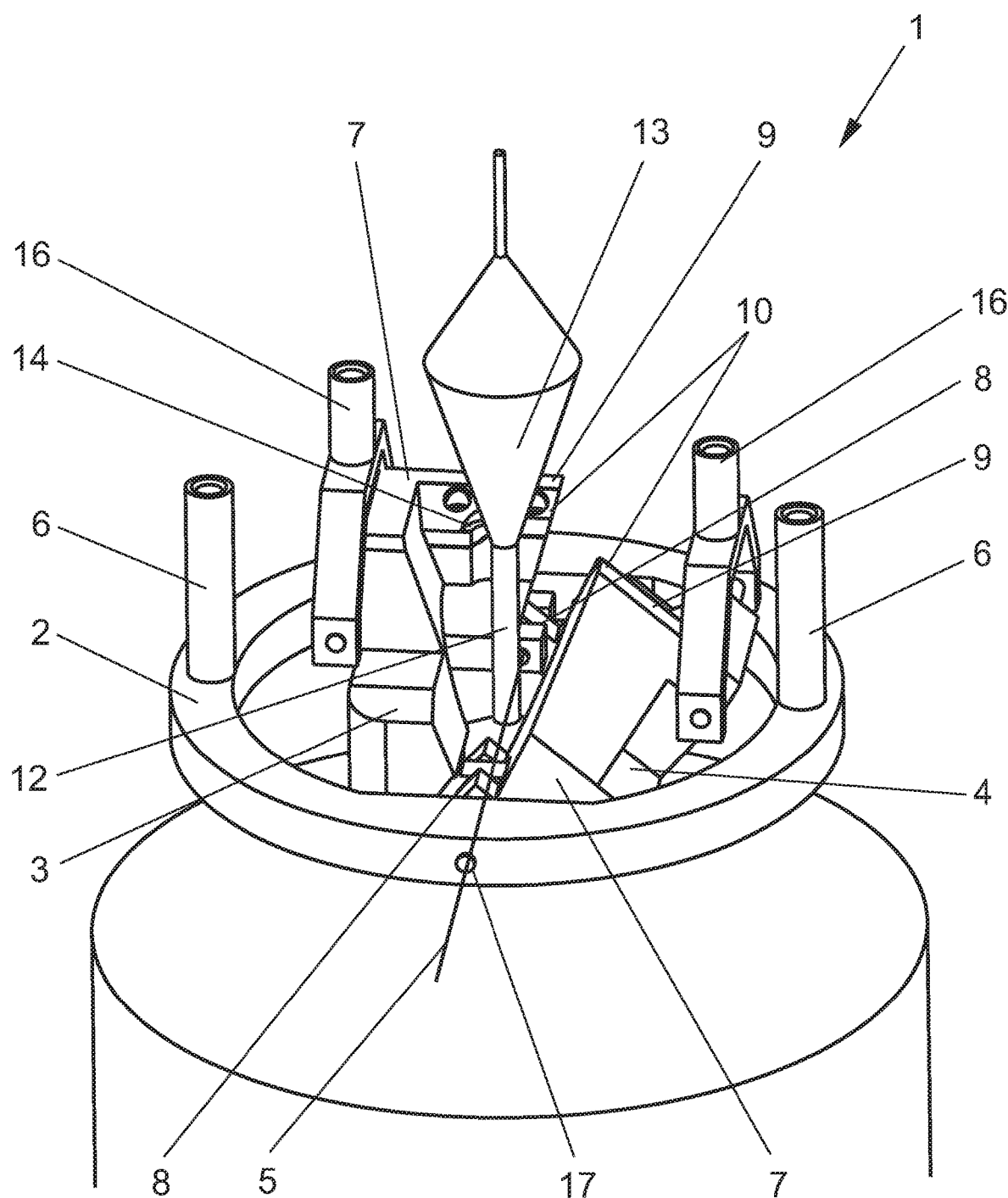
FIG. 1 shows a perspective illustration of a first embodiment of the invention.

Reference is first of all made to FIG. 1. This shows a crystal support 1 with an annular carrier 2, on which two catches 3, 4 are mounted opposite one another in pivot bearings 8, the axes of which lie on a common straight line 5 passing through the center of the carrier. Located on the carrier 2 in a manner offset through 90° with respect to the straight line 5 are two control cable holders 6, which are connected to control cable drums in the head of the crystal pulling device.

Each catch 3, 4 consists of an arcuate bracket 7, the ends of which that are directly downwardly, toward the carrier 2 each end in one of the pivot bearings 8, which consists of a bearing stub 17 which is directed inwardly into the carrier and onto which the ends are plugged. The vertex of the bracket 7 is directed upward, i.e., in the direction of the head of the crystal pulling device.

With regard to a crystal plane, the two brackets 7 are located opposite one another, wherein the mutually facing sides of the brackets 7 each have a base 9. The crystal plane is defined by the axis of the crystal and by the straight line 5 on which the axes of the pivot bearings lie. When the axes of the pivot bearings for the two catches are spaced apart from one another, the crystal plane extends parallel thereto. The bases 9 are offset with respect to one another and with respect to the middle of the bracket 7, such that, with the catches 3, 4 deployed, the inner sides, facing toward the center of the carrier, of the bases are located opposite one another and each form a retaining jaw 10.

When the catches are folded together, the inner sides of the bases 9 run past one another such that the retaining jaws 10 are located opposite one another at a small spacing. A parting plane between the retaining jaws 10 thus extends perpendicularly to the straight line 5. The retaining jaws 10 have a spacing which is chosen to be large enough that it is slightly larger than the thickness of the neck 12 of a crystal below a thickened neck portion 13, such that the bases 9 slide past on both sides of the neck 12 when the two catches are moved into their deployed bearing position, as is shown for the catch illustrated on the left in FIG. 1.

Each retaining jaw 10 has a semicircular cutout 14 in its inner side, these being located opposite one another with the catches 3, 4 deployed, such that a conical receptacle is formed, which largely encloses the thickened neck portion 13 from below. With this arrangement, the contact points of each retaining jaw are located on both sides of the crystal plane. The crystal is thus supported not only in a direction perpendicular to the crystal plane, as described in the prior art, but also in the crystal plane.

Mounted on the rear sides of the brackets 7 are pivotable supporting cable holders 16, which are connected to a supporting cable drum in the head of the crystal pulling device. In this embodiment, the supporting cables and the control cables lie in one plane.

Figure 2:
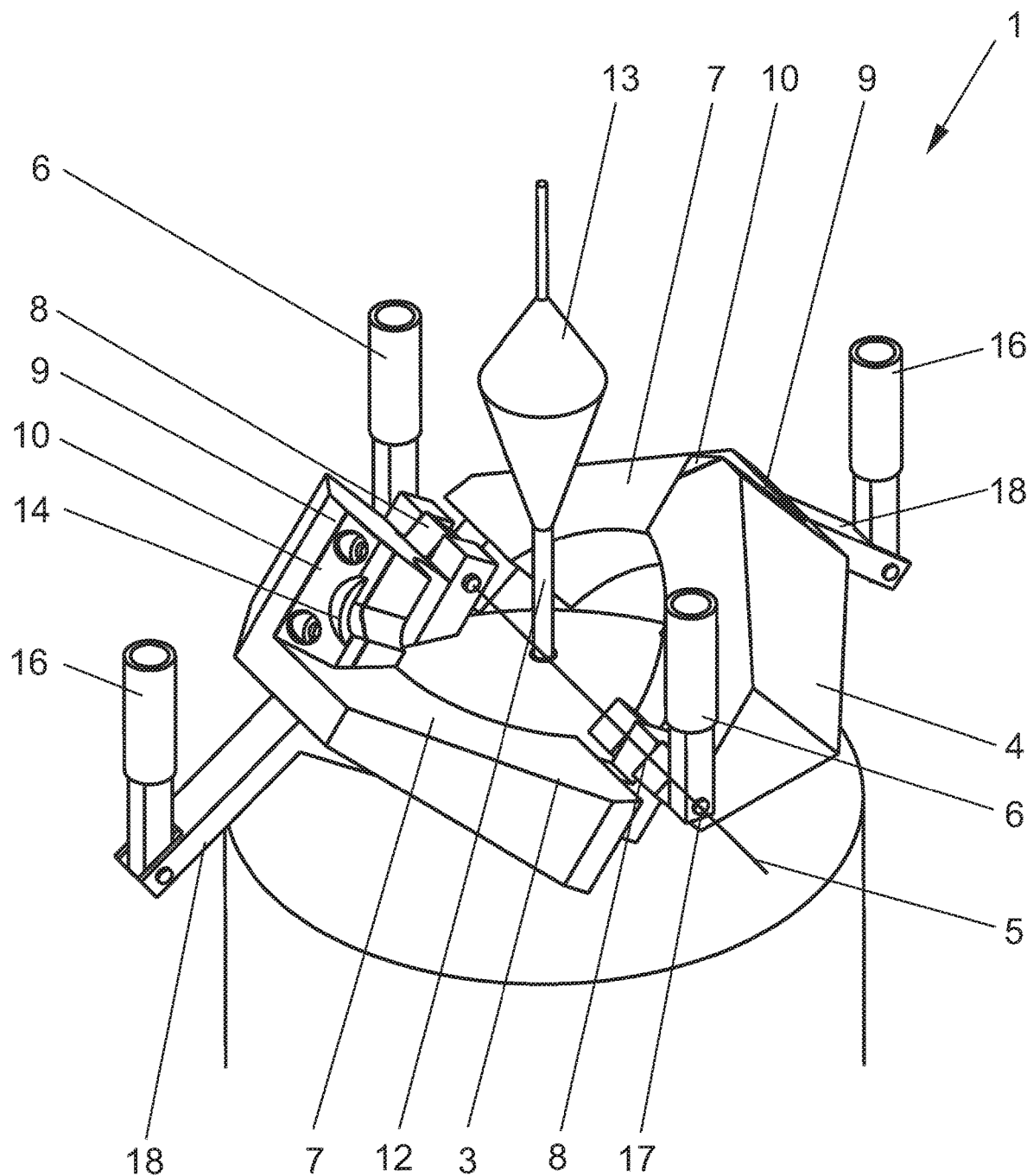
FIG. 2 shows a perspective illustration of a second embodiment of the invention.

FIG. 2 shows a further embodiment, in which an annular carrier has been dispensed with. The carrier is instead reduced to bearing stubs 17 on which the catches 3, 4 are mounted and are connected to the control cable holders 6. Located on the rear sides of each of the catches 3, 4 is an arm 18, in each of which the supporting cable holders 16 for the catches 3, 4 are pivotably mounted.

The crystal support is raised conjointly with the pulling of a crystal, wherein the catches 3, 4, which are folded outward, are located just beneath the thickened neck portion 13 in their releasing position. When the crystal has reached a particular size and a particular weight, the catches 3, 4 are folded inward, in that, for example, the carrier 2 or the bearing stubs 17 are lowered. To this end, the control cables are lowered and the supporting cables are initially left in position. This inevitably has the result that the catches 3, 4 are flapped upward into their retaining position and thus toward one another, with the result that the retaining jaws 10 form the receptacle for the thickened neck portion 13. As a result of the supporting cables being pulled, the retaining jaws 10 are placed from below against the thickened neck portion 13, such that the supporting cables take on the weight of the crystal.

Figure 3:
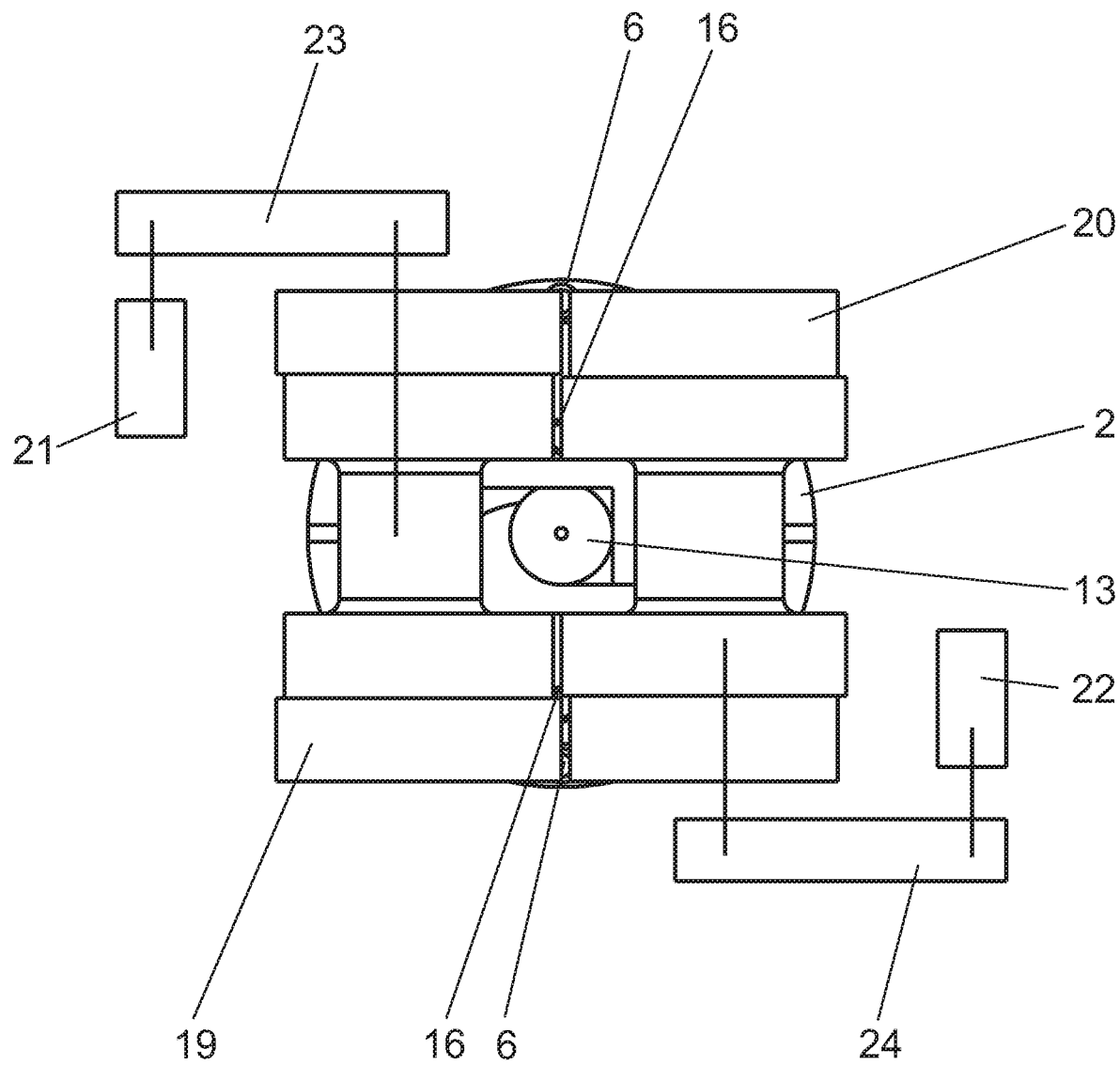
FIG. 3 shows a plan view of the suspension of the cable pulls on two drums.

In particular in the embodiments in which the control cables and the supporting cables lie in one place, a pair of cable drums can be used, as is illustrated in FIG. 3. The two cable drums 19, 20 are approximately dumbbell shaped and extend parallel to one another. Each dumbbell consists of two heads, which are connected together via a cross-sectionally smaller bar. Each head of a dumbbell serves to receive a cable, wherein the control cables, in order to control the crystal support, i.e., to fold the catches in and out, are wound onto the two heads of one cable drum 19, and the supporting cables, which act on the catches, are wound onto the heads of the other cable drum 20.

The cables are each received in the heads on the inner side of the cable drum 19, 20, this being the side that faces the other cable drum 20, 19 in each case. Drives 21, 22 for the cable drums 19, 20 each lie parallel to the cable drums 19, 20 and are each transmitted to the associated cable drum 19, 20 via a double deflection 23, 24.

LIST OF REFERENCE CHARACTERS

1 Crystal support
2 Carrier
3 Catch
4 Catch
5 Straight line
6 Control cable holders
7 Bracket
8 Pivot bearing
9 Base
10 Retaining jaw
12 Neck
13 Thickened neck portion
14 Cutout
16 Supporting cable holders
17 Bearing stub
18 Arm
19 Supporting cable drum
20 Control cable drum 21 Drive
22 Drive
23 Deflection
24 Deflection

The invention claimed is:

1. A crystal support for a crystal pulling system, comprising:
two catches, wherein the two catches are each foldable about a respective pivot axis and wherein the two catches each have a respective retaining jaw that is placeable against a thickened neck portion of a crystal to be pulled;
wherein the two catches are moveable into a bearing position in which the two catches bear on the thickened neck portion and into a releasing position in which the two catches are away from the thickened neck portion and wherein, in the bearing position, respective contact points of each retaining jaw at which the retaining jaws bear on the thickened neck portion are located on respective sides of a parting plane; and
wherein the parting plane extends at an angle to at least one of the pivot axes and wherein, in the bearing position, the respective contact points of each retaining jaw are located on both sides of a crystal plane that extends through an axis of the crystal and parallel to one of the pivot axes.

2. The crystal support according to claim 1, wherein the pivot axes extend parallel to or coaxially with one another and wherein the parting plane extends perpendicularly to the pivot axes.

3. The crystal support according to claim 1, wherein the two catches are connected to a respective supporting cable holder.

4. The crystal support according to claim 3, wherein the respective supporting cable holder is mounted on the respective catch about an axis extending parallel to the respective pivot axis.

5. The crystal support according to claim 1, wherein the two catches are mounted pivotably on a carrier which has a central clearance and wherein two control cable holders are disposed on a top side of the carrier.

6. The crystal support according to claim 5, wherein the two control cable holders are disposed in an offset manner with respect to the pivot axes.

7. The crystal support according to claim 5, wherein the pivot axes are formed by bearing stubs to which the two control cable holders are fastened.

8. The crystal support according to claim 1, wherein each of the two catches is formed by a respective bracket, wherein mounting of the respective catch on the respective pivot axis takes place at ends of the respective bracket, wherein a respective base is disposed to a side of a vertex of the respective bracket, and wherein the base protrudes perpendicularly from the bracket and has, on a side facing the vertex of the bracket, an inner side that extends obliquely or perpendicularly to the bracket and forms the respective retaining jaw.

9. The crystal support according to claim 1, wherein each retaining jaw has a semicircular cutout in an inner side of the retaining jaw, wherein the respective semicircular cutouts are disposed opposite one another in the bearing position of the two catches such that a conical receptacle is formed which largely encloses the thickened neck portion from below and such that the respective contact points of each retaining jaw are located on both sides of the crystal plane and such that the crystal is supported not only in a direction perpendicular to the crystal plane but also in the crystal plane.

10. A crystal pulling system, comprising:
the crystal support according to claim 1;
a supporting cable drum; and
a control cable drum;
wherein the supporting cable drum and the control cable drum are disposed in a head of the crystal pulling system;
wherein a supporting cable is received on a side of the supporting cable drum and a control cable is received on a side of the control cable drum and wherein the side of the supporting cable drum faces the side of the control cable drum.

11. A crystal support according to claim 1, wherein the parting plane is located between the retaining jaws and wherein the parting plane extends at an angle of greater than 0 degrees to at least one of the pivot axes.

12. A crystal support according to claim 1, wherein the parting plane is located between the retaining jaws and wherein the parting plane is non-parallel to at least one of the pivot axes.

13. A crystal support according to claim 1, wherein at least one of the catches has an arcuate shape with two ends and wherein the ends are mounted to its pivot axis.

* * * * *